United States Patent
Hong et al.

(10) Patent No.: US 6,964,030 B2
(45) Date of Patent: Nov. 8, 2005

(54) METHOD FOR AUTOMATIC MASK TOOL TRANSLATION

(75) Inventors: Hsin-Ming Hong, Changhua (TW); Piao-Chuo Tsao, Bade (TW); Shu-Ling Feng, Hsinchu (TW); Yi-Hong Tseng, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 197 days.

(21) Appl. No.: 10/404,484

(22) Filed: Apr. 1, 2003

(65) Prior Publication Data

US 2004/0199895 A1 Oct. 7, 2004

(51) Int. Cl.$^7$ .............................................. G06F 17/50
(52) U.S. Cl. ........................................ 716/12; 716/19
(58) Field of Search ..................................... 716/12, 19

(56) References Cited

U.S. PATENT DOCUMENTS

| 5,784,292 | A | * | 7/1998 | Kumar ......................... 716/19 |
| 6,643,841 | B2 | * | 11/2003 | Chang et al. .................. 716/19 |
| 2002/0093514 | A1 | * | 7/2002 | Edwards et al. ............. 345/626 |
| 2004/0158344 | A1 | * | 8/2004 | Inobe et al. ................. 700/121 |

* cited by examiner

Primary Examiner—Vuthe Siek
Assistant Examiner—Sun James Lin
(74) Attorney, Agent, or Firm—Duane Morris LLP; Steven E. Koffs

(57) ABSTRACT

A method for translating mask tooling information comprises the steps of: receiving a plurality of input mask tooling forms for fabricating a wafer, at least two of the plurality of input masking tool forms having respectively different sequences of layers; forming a template having a sequence of layers formed by the union of the different sequences of layers; and translating information from each of the input mask tooling forms to fit the template.

23 Claims, 2 Drawing Sheets

METHOD FOR AUTOMATIC MASK TOOL TRANSLATION

FIELD OF THE INVENTION

The present invention is related to semiconductor fabrication generally, and more specifically to mask tool generation.

BACKGROUND

The MPW (Multi Project Wafer) business model allows fabrication of different devices (or integrated circuits, ICs) on the same wafer using the same set of masks. In an MPW service, different devices might use different process technologies with different number of mask layers.

In a MPW service, the mask tooling (MT) information of each product is described in different MT Form. Therefore, there are several MT Forms with different masking information created for a MPW service. Before making a mask-set for a MPW project, a TIP (Tooling Information Preparation) is prepared first. The key operation of the TIP preparation is mask tooling circuit layer information translation, in which all different MT Forms are normalized to meet the TIP specification.

In the prior art, the circuit layer translation was done manually. This caused the potential risk of mis-operation and was time-consuming.

SUMMARY OF THE INVENTION

A method for translating mask tooling information comprises the steps of: receiving a plurality of input mask tooling forms for fabricating a wafer, at least two of the plurality of input masking tool forms having respectively different sequences of layers; forming a template having a sequence of layers formed by the union of the different sequences of layers; and translating information from each of the input mask tooling forms to fit the template.

DETAILED DESCRIPTION

Figure 1:
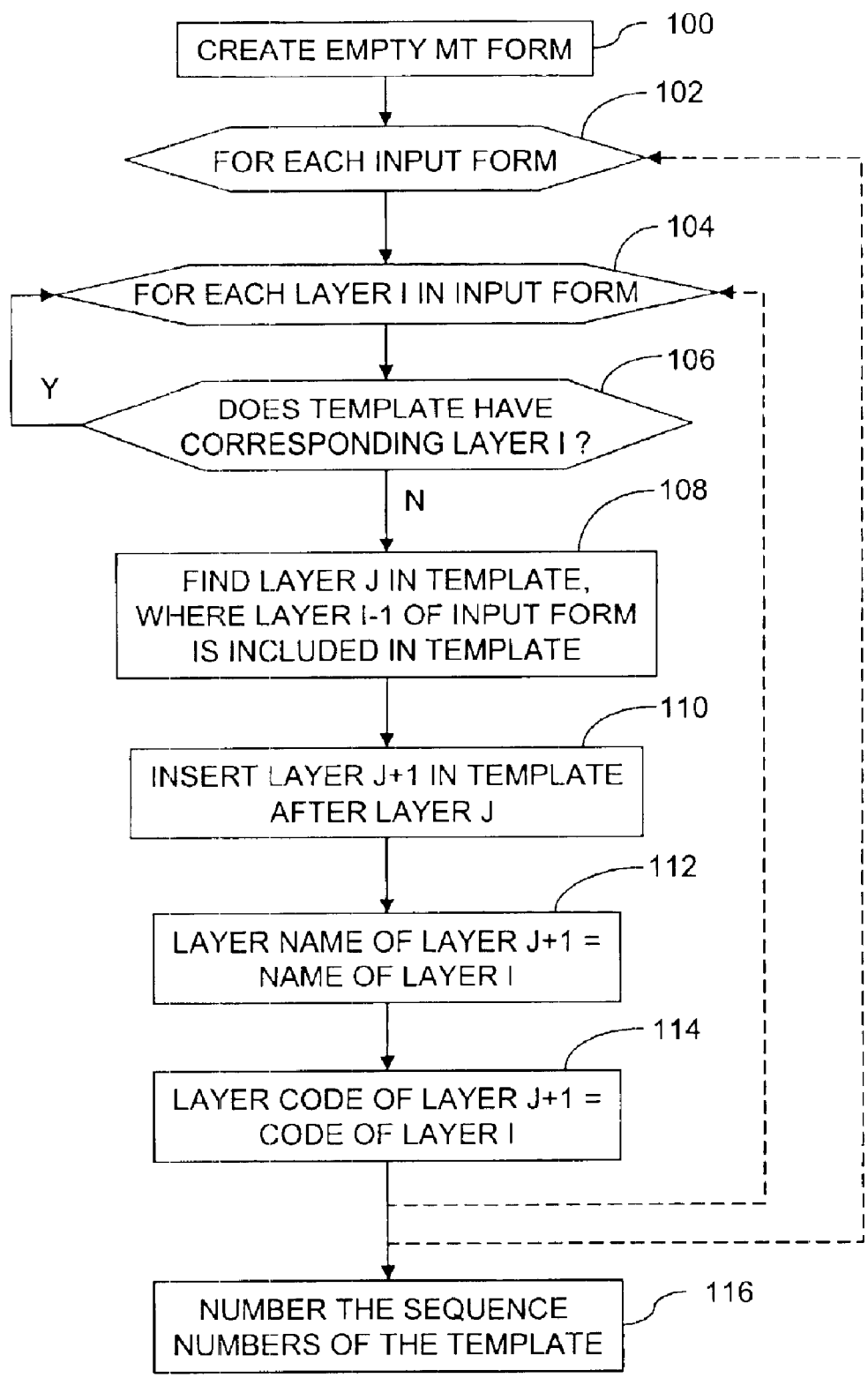
FIG. 1 is a flow chart of an exemplary method for generating a normalized mask tooling template.

FIG. 1 is a flow chart diagram of an exemplary method for forming a "normalized" mask tooling (MT) template from a plurality of input mask tooling forms. The "normalized" MT template is suitable for use in fabricating an MPW. A TIP (Tooling Information Preparation) is prepared by a mask tooling circuit layer information translation operation, in which, all of the different input MT Forms are normalized to meet the TIP specification. Using the translated information, a single MT kit can be generated to define all of the masking for each of the plurality of different IC types on a single wafer (MPW). Thus, the MT template includes the superset or union of all of the layers that are to be deposited on the MPW.

At step 100, an empty MT form template is created. In the example, the MT form template can accommodate a plurality of layers. Each layer has four attributes: a sequence number (sn), a mask layer name (lyr_name), a circuit layer number (lyr_no) and a mask layer code (lyr_code).

At step 102, a loop including steps 104–114 is executed for each input MT form (corresponding to a respective IC or device to be included in the MPW).

At step 104, a loop including steps 106 to 114 is executed for each layer i of the input form.

At step 106, a determination is made whether the MT template has a layer corresponding to layer i of the input MT form. If the MT template already has such a layer, then step 104 is executed for the next succeeding layer i+1. If the template does not yet have a corresponding layer, step 108 is executed.

At step 108, a search is made through the existing layers of the MT template to find a layer j, such that layer i−1 of the input MT form corresponds to layer j of the MT template.

At step 110, a new layer j+1 is inserted into the MT template after the layer j.

At step 112, the layer name of the new layer j+1 is assigned to be the same as that of layer i of the input MT form.

At step 114, the layer code of the new layer j+1 is assigned to be the same as that of layer i of the input MT form.

If there are additional layers in the input MT form, then the loop of steps 106–114 are repeated for each remaining layer of the input MT form.

If there are additional input MT forms for the same MPW MT kit, then steps 104–114 are repeated for each remaining input MT form.

After all of the input MT forms have been processed, the MT template now has a set of layers that includes all of the layers in any of the input MT forms. Further, these layers have been inserted in an appropriate sequence for forming the MPW. The template can be used for generating a single mask set for the MPW, with each individual IC having its respective set of layers in the appropriate sequence.

At step 116, sequence numbers are applied to the MT template. The sequence numbers can be the set of integers from one to the number of layers in the MT template.

An exemplary set of pseudocode for the above described procedure is set forth below. This pseudocode can be implemented in any of a variety of computer programming languages, for automatically performing the method.

1. Create the MTForm Template with the Following Rules

```
1.1 Create an empty MTForm template, denoted as MTT
1.2 For each MT Form, denoted as MTF(m)
    1.2.1 For each layer, denoted as lyr(i) in the MTForm MTF(m)
        If the MTF (m).lyr(i).lyr_code doesn't exist in the MTForm
           template MTT
        then (1) locate the sequence j where MTT.lyr(j).lyr_code =
           MTF(m).lyr(i−1).lyr_code, if i = 1 then j = 0
           (2) insert a new layer MTT.lyr(j+1) at sequence j+1 with
               MTT.lyr(j+1).lyr_name =
                  MTF(m).lyr(i).lyr_name
               MTT.lyr(j+1).lyr_code =
                  MTF(m).lyr.(i).lyr_code
        Endif
    EndFor
EndFor
```

1.3 Number the Sequence Number of MTT

Tables 1A–1C and 2A–2E provide an example of construction of an MT form template. Tables 1A–1C show three input MT forms with three different technologies. Note that Device 1P3M (Table 1A) lacks the following layers: VIA2, VIA3, M3 and M4. Device 1P4M (Table 1B) lacks the following layers: L4, VIA3, M4. Device 1P5M (Table 1C) lacks the following layers: L3 and L4. In this example, none of the three devices has the same set of layers as any other device, and none of the devices includes all of the layers found in the union of the layers of all three devices.

TABLE 1A

Device 1P3M

| No | Mask Layer Name | Mask Layer Code | CKT-Layer |
|---|---|---|---|
| 1 | L1 | 119 | 1 |
| 2 | L2 | 120 | 2 |
| 3 | L3 | 121 | 3 |
| 4 | L4 | 191 | 4 |
| 5 | CONTACT | 118 | 5 |
| 6 | M1 | 160 | 16 |
| 7 | VIA1 | 178 | 17 |
| 8 | M2 | 180 | 18 |
| 9 | Top VIA | 174 | 29 |
| 10 | Top Metal | 185 | 31 |
| 11 | PAD | 107 | 19 |

TABLE 1B

Device 1P4M

| No | Mask Layer Name | Mask Layer Code | CKT-Layer |
|---|---|---|---|
| 1 | L1 | 119 | 1 |
| 2 | L2 | 120 | 2 |
| 3 | L3 | 121 | 3 |
| 4 | CONTACT | 118 | 4 |
| 5 | M1 | 160 | 16 |
| 6 | VIA1 | 178 | 17 |
| 7 | M2 | 180 | 18 |
| 8 | VIA2 | 179 | 27 |
| 9 | M3 | 181 | 28 |
| 10 | Top VIA | 174 | 32 |
| 11 | Top Metal | 185 | 33 |
| 12 | PAD | 107 | 19 |

TABLE 1C

Device 1P5M

| No | Mask Layer Name | Mask Layer Code | CKT-Layer |
|---|---|---|---|
| 1 | L1 | 119 | 1 |
| 2 | L2 | 120 | 2 |
| 3 | CONTACT | 118 | 3 |
| 4 | M1 | 160 | 16 |
| 5 | VIA1 | 178 | 17 |
| 6 | M2 | 180 | 18 |
| 7 | VIA2 | 179 | 27 |
| 8 | M3 | 181 | 28 |
| 9 | VIA3 | 173 | 29 |
| 10 | M4 | 184 | 31 |
| 11 | Top VIA | 174 | 39 |
| 12 | Top Metal | 185 | 38 |
| 13 | PAD | 107 | 19 |

Tables 2A–2E provide an example of the construction of an MT form template for the three devices set forth in Tables 1A–1C, to allow creation of an MT kit for an MPW that includes all three devices, 1P3M and 1P4 and 1P5M.

Table 2A shows an empty MT form template (as formed in step 100).

TABLE 2A

| No | Mask Layer Name | Mask Layer Code |
|---|---|---|

Table 2B shows the MT template of Table 1, after executing the loop of steps 106–114 for the layers of device 1P3M (Table 1A). Because the template is initially empty, each iteration of steps 106–114 results in the addition of another layer to the MT form template. After 11 iterations the MT form template has a respective layer with the same layer name and layer code as a corresponding layer of device 1P3M in Table 1A.

TABLE 2B

| No | Mask Layer Name | Mask Layer Code |
|---|---|---|
|  | L1 | 119 |
|  | L2 | 120 |
|  | L3 | 121 |
|  | L4 | 191 |
|  | CONTACT | 118 |
|  | M1 | 160 |
|  | VIA1 | 178 |
|  | M2 | 180 |
|  | Top VIA | 174 |
|  | Top Metal | 185 |
|  | PAD | 107 |

Table 2C shows the contents of the MT form template after repeating steps 106–114 for each layer in device 1P4M (Table 1B). Device 1P4M has two additional layers not present in device 1P3M: layers VIA2 and M3. Thus, for the layers L1 to M2 and Top VIA to PAD, when steps 106–114 are executed for this device, at step 106 the corresponding layer is found in the template, and execution returns to step 104. When the VIA2 layer is encountered in Table 1B, there is no corresponding layer in the MT form template. The VIA2 layer is inserted in the MT form template after the layer which precedes VIA2 in Table 1B, namely after M2. Similarly, when M3 is encountered in Table 1B, there is no corresponding layer in the MT form template, so the M3 layer is inserted in the MT form template after the layer which precedes M3 in Table 1B, namely VIA2.

TABLE 2C

| No | Mask Layer Name | Mask Layer Code |
|---|---|---|
|  | L1 | 119 |
|  | L2 | 120 |
|  | L3 | 121 |
|  | L4 | 191 |
|  | CONTACT | 118 |
|  | M1 | 160 |
|  | VIA1 | 178 |
|  | M2 | 180 |
|  | VIA2 | 179 |
|  | M3 | 181 |
|  | Top VIA | 174 |
|  | Top Metal | 185 |
|  | PAD | 107 |

Table 2D shows the contents of the MT form template after repeating steps 106–114 for each layer in device 1P5M (Table 1C). Device 1P5M has two additional layers not present in device 1P3M or 1P4M: layers VIA3 and M4. Thus, for the layers L1 to M3 and Top VIA to PAD, when steps 106–114 are executed for this device, at step 106 the corresponding layer is found in the template, and execution returns to step 104. When the VIA3 layer is encountered in Table 1C, there is no corresponding layer in the MT form template. The VIA3 layer is inserted in the MT form template after the layer which precedes VIA3 in Table 1C, namely after M3. Similarly, when M4 is encountered in Table 1C, there is no corresponding layer in the MT form template, so the M4 layer is inserted in the MT form template after the layer which precedes M4 in Table 1C, namely VIA3.

TABLE 2D

| No | Mask Layer Name | Mask Layer Code |
|---|---|---|
| | L1 | 119 |
| | L2 | 120 |
| | L3 | 121 |
| | L4 | 191 |
| | CONTACT | 118 |
| | M1 | 160 |
| | VIA1 | 178 |
| | M2 | 180 |
| | VIA2 | 179 |
| | M3 | 181 |
| | VIA3 | 173 |
| | M4 | 184 |
| | Top VIA | 174 |
| | Top Metal | 185 |
| | PAD | 107 |

Table 2E shows the contents of the MT template form after step 116 is executed. The 15 layers are numbered consecutively, for example, from 1 to 15.

TABLE 2E

| No | Mask Layer Name | Mask Layer Code |
|---|---|---|
| 1 | L1 | 119 |
| 2 | L2 | 120 |
| 3 | L3 | 121 |
| 4 | L4 | 191 |
| 5 | CONTACT | 118 |
| 6 | M1 | 160 |
| 7 | VIA1 | 178 |
| 8 | M2 | 180 |
| 9 | VIA2 | 179 |
| 10 | M3 | 181 |
| 11 | VIA3 | 173 |
| 12 | M4 | 184 |
| 13 | Top VIA | 174 |
| 14 | Top Metal | 185 |
| 15 | PAD | 107 |

Figure 2:
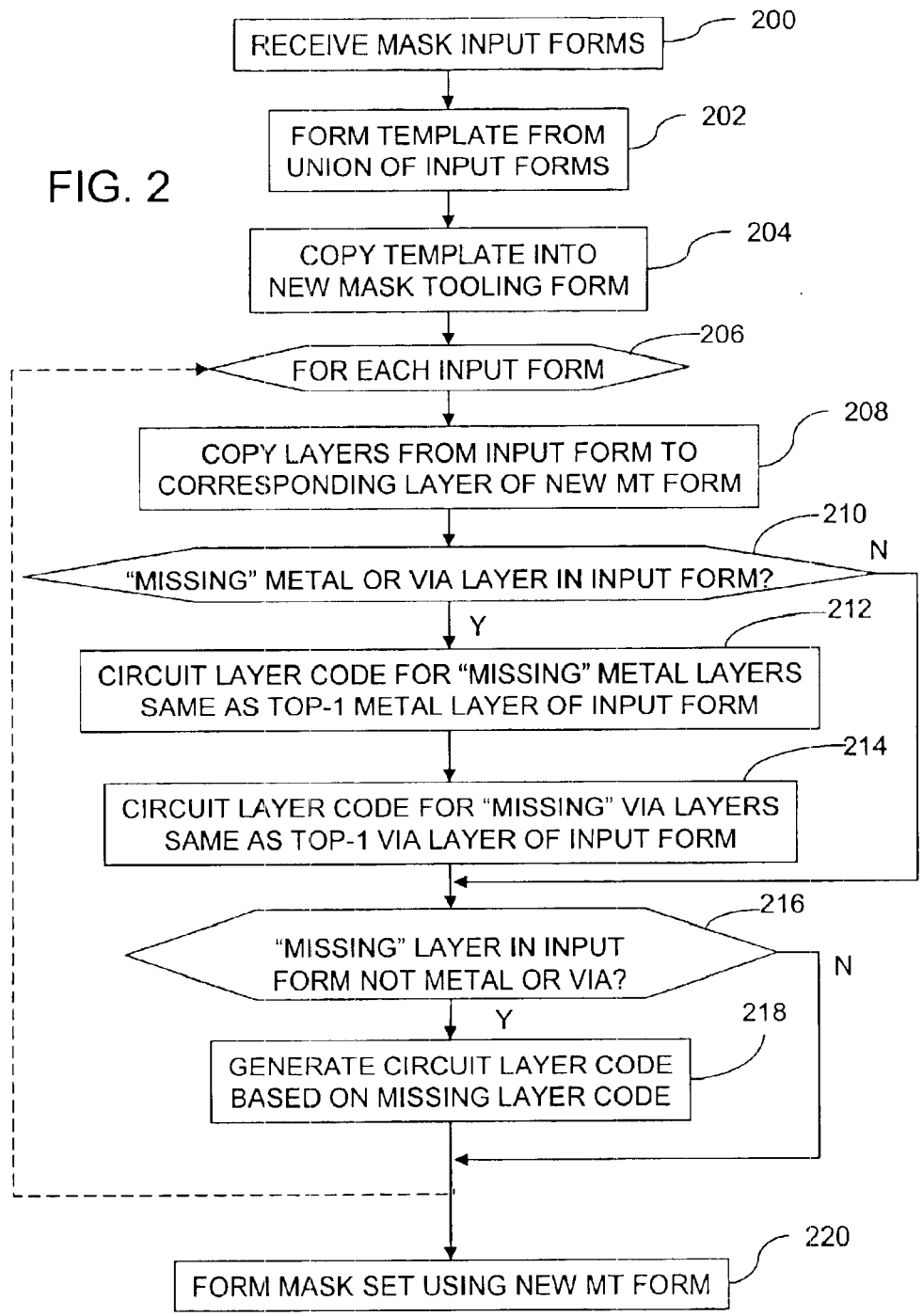
FIG. 2 is a flow chart of a translation process using the template formed in FIG. 1.

FIG. 2 is a flow chart diagram showing an exemplary method for automatically generating a mask tooling form based on a plurality of input mask tooling forms, and using an MT form template formed according to the method of FIG. 1. The exemplary method is suitable for translating mask tooling information for use in a fabricating an MPW.

At step 200, a plurality of input mask tooling forms for fabricating a wafer are received. At least two of the plurality of input masking tool forms have respectively different sequences of layers. For example, the Tables 1A–1C described above include a plurality of input MT forms.

In the example, each input mask tooling form has a plurality of layers. Each layer has four attributes: a sequence number (sn), a mask layer name (lyr_name), a mask layer code (lyr_code), and a circuit layer number (lyr_no).

At step 202, an MT tool template having a sequence of layers is formed by the union of the different sequences of layers. Step 202 is performed by the detailed method shown in FIG. 1.

At step 204, the MT tool template corresponding to the set of input MT forms (e.g., as shown in Table 2E) is copied into a new MT form.

At step 206, a loop is executed for each input MT form, including steps 208–218.

At step 208, each circuit layer number in the input MT form is copied into the circuit layer number column of the corresponding row of the new MT form (i.e., the row having the same mask layer code).

At step 210, a determination is made whether there is a missing metal or via layer in the input MT form (i.e., a layer that is included in the MT template, but not in the input MT form). If there is a missing metal or via layer, then the appropriate one of steps 212 or 214 is executed.

At step 212, if a metal layer of the new (translated) MT form is not included in the input MT form, then the corresponding layer code of the new MT form is set equal to the circuit layer code of a penultimate (top-1) metal layer in that input MT form. When the new MT form is subsequently used to generate a set of masks for an MPW, the metal pattern of the penultimate metal layer in this IC or device is repeated on the inserted layer.

At step 214, if a via layer of the new (translated) MT form is not included in the input MT form, then the corresponding layer code of the new MT form is set equal to the circuit layer code of a penultimate (top-1) via layer in that input MT form. When the new MT form is subsequently used to generate a set of masks for an MPW, the via pattern of the penultimate via layer in this IC or device is repeated on the inserted layer.

At step 216, a determination is made whether there is a missing layer in the input MT form that is neither a metal or via (i.e., a layer that is included in the MT template, but not in the input MT form). If there is a missing layer, then step 218 is executed.

At step 218, for a layer that is neither a metal or a via layer, a new circuit layer code is generated based on the circuit layer code of the layer in the new MT form that is missing from the input MT form. For example, in some embodiments, the letter "A" is appended to the end of the circuit layer code of the layer in the new MT form for which there is no corresponding layer in the input MT form. Any other method may be used for generating a circuit layer code based on the circuit layer code of the missing layer, such that the generated code is distinguishable from any of the circuit layer codes that could be encountered in input MT forms. For example, different characters or patterns may be appended to the circuit layer code, or a function such as a hash function may be generated from the circuit layer code. When the new MT form is subsequently used to generate a set of masks for an MPW, the distinguishable generated circuit layer code is recognized, so that no circuit layer patterns are required for this particular IC or device at this layer when producing the mask set.

If there are additional input MT forms for the same MPW, then steps 208–218 are repeated for each input MT form.

At step 220, the new MT form now contains translated versions of each of the input MT forms, and is ready to be used as an input for forming a mask set suitable for use in an MPW project.

Pseudocode is provided below for translating the input forms into the standardized MT form format.

3 Translate the Old MTForms to New MTForms with the Following Rules 3.1 For each old MTForm, denoted as o_MTF(m)
   3.1.1 Create new MTForm, denoted as n_MTF(m) based on MTT
   3.1.2 Copy each layer in old MTForm to new MTForm with following rules
      For each layer, denoted as lyr(i) in o_MTF(m)

-continued

```
    locate the sequence j where n_MTF(m).lyr(j).lyr_code =
    o_MTF(m).lyr(i).lyr_code
        set n_MTF(m).lyr(j).lyr_no = o_MTF(m).lyr(i).lyr_no
    EndFor
3.1.3 Get lyr_code of Top - 1 metal layer (if the device is 1PXM,
    then the Top-1 metal layer is X-1)
3.1.4 Get lyr_code of Top - 1 via layer (if the device is 1PXM,
    then the Top-1 metal layer is X-2)
3.1.5 For the layer, denoted as lyr(e), in n_MTF(m) with
    blank lyr_no
        If n_MTF(m).lyr(e) is not a metal layer nor via layer
        then n_MTF(m).lyr(e).lyr_no = n_MTF(m).lyr(e).lyr_code +
        'A'
            Else if the layer is a metal layer
            then n_MTF(m).lyr(e).lyr_no = lyr_code of Top -1
            metal layer
            Else if the layer is via layer
            then n_MTF(m).lyr(e).lyr_no = lyr_code of Top -1 via
            layer
        Endif
    EndFor
EndFor
```

Tables 3A–3G provide an example of the translation method described above with reference to FIG. 2. Table 3A shows a new MT form which is generated (at step 202) using the MT template described above. In this case, the same input forms and MT template are used as in tables 1A–1C and 2A–2E. The new MT form of Table 3A has an additional column for the final circuit layer numbers that are assigned to each layer.

TABLE 3A

| No | Mask Layer Name | Mask Layer Code | CKT-Layer |
|----|-----------------|-----------------|-----------|
| 1  | L1              | 119             |           |
| 2  | L2              | 120             |           |
| 3  | L3              | 121             |           |
| 4  | L4              | 191             |           |
| 5  | CONTACT         | 118             |           |
| 6  | M1              | 160             |           |
| 7  | VIA1            | 178             |           |
| 8  | M2              | 180             |           |
| 9  | VIA2            | 179             |           |
| 10 | M3              | 181             |           |
| 11 | VIA3            | 173             |           |
| 12 | M4              | 184             |           |
| 13 | Top VIA         | 174             |           |
| 14 | Top Metal       | 185             |           |
| 15 | PAD             | 107             |           |

Tables 3B–3D show the iteration of steps 208–218 of FIG. 2 applied to device 1P3M (Table 1A). In Table 3B, all of the circuit layer numbers of the MT template that are present in table 1A are copied into the corresponding rows of the new MT form. Layers 9–12 (VIA2, M3, VIA3, M4) are not included in this device.

TABLE 3B

| No | Mask Layer Name | Mask Layer Code | CKT-Layer |
|----|-----------------|-----------------|-----------|
| 1  | L1              | 119             | 1         |
| 2  | L2              | 120             | 2         |
| 3  | L3              | 121             | 3         |
| 4  | L4              | 191             | 4         |
| 5  | CONTACT         | 118             | 5         |
| 6  | M1              | 160             | 16        |
| 7  | VIA1            | 178             | 17        |
| 8  | M2              | 180             | 18        |

TABLE 3B-continued

| No | Mask Layer Name | Mask Layer Code | CKT-Layer |
|----|-----------------|-----------------|-----------|
| 9  | VIA2            | 179             |           |
| 10 | M3              | 181             |           |
| 11 | VIA3            | 173             |           |
| 12 | M4              | 184             |           |
| 13 | Top VIA         | 174             | 29        |
| 14 | Top Metal       | 185             | 31        |
| 15 | PAD             | 107             | 107       |

Table 3C shows the missing rows filled in for this device. The penultimate via layer (17) is identified, and the circuit layer code 17 is copied into the VIA2 and VIA3 rows. The penultimate metal layer (18) is identified, and the circuit layer code 18 is copied into the M3 and M4 rows.

Subsequently, when making masks, the circuit layer number 17 and 18 will be printed on the 1P3M device area for the following layers: No. 17 is printed on Via1, Via2, Via3; No. 18 is printed on M2, M3, M4. If blank circuits would be used to create mask levels of Via2, M3, Via3 and M4, then the 'circuit density' would not be even on the masks, i.e. there will be no circuit being printed on the device 1 area. That would impact the quality of mask making and wafer making. By repeating No. 17 on VIA2 and VIA3, and No. 18 on M3 and M4, this problem is avoided.

TABLE 3C

| No | Mask Layer Name | Mask Layer Code | CKT-Layer |
|----|-----------------|-----------------|-----------|
| 1  | L1              | 119             | 1         |
| 2  | L2              | 120             | 2         |
| 3  | L3              | 121             | 3         |
| 4  | L4              | 191             | 4         |
| 5  | CONTACT         | 118             | 5         |
| 6  | M1              | 160             | 16        |
| 7  | VIA1            | 178             | 17        |
| 8  | M2              | 180             | 18        |
| 9  | VIA2            | 179             | 17        |
| 10 | M3              | 181             | 18        |
| 11 | VIA3            | 173             | 17        |
| 12 | M4              | 184             | 18        |
| 13 | Top VIA         | 174             | 29        |
| 14 | Top Metal       | 185             | 31        |
| 15 | PAD             | 107             | 107       |

Tables 3D–3E show the iteration of steps 208–218 of FIG. 2 applied to device 1P4M (Table 1B). In Table 3D, all of the circuit layer numbers of the MT template that are present in table 1B are copied into the corresponding rows of the new MT form. Layers 4, 11 and 12 (L4, VIA3, M4) are not included in this device.

TABLE 3D

| No | Mask Layer Name | Mask Layer Code | CKT-Layer |
|----|-----------------|-----------------|-----------|
| 1  | L1              | 119             | 1         |
| 2  | L2              | 120             | 2         |
| 3  | L3              | 121             | 3         |
| 4  | L4              | 191             |           |
| 5  | CONTACT         | 118             | 4         |
| 6  | M1              | 160             | 16        |
| 7  | VIA1            | 178             | 17        |
| 8  | M2              | 180             | 18        |
| 9  | VIA2            | 179             | 27        |
| 10 | M3              | 181             | 28        |
| 11 | VIA3            | 173             |           |

TABLE 3D-continued

| No | Mask Layer Name | Mask Layer Code | CKT-Layer |
|---|---|---|---|
| 12 | M4 | 184 | |
| 13 | Top VIA | 174 | 32 |
| 14 | Top Metal | 185 | 33 |
| 15 | PAD | 107 | 19 |

In Table 3E, the three missing rows of the circuit layer number column are filled in. The penultimate via layer, VIA2 is copied into row 11 (VIA3). The penultimate metal layer, M3 is copied into row 12 (M4). In the case of the missing layer (4) that is neither via or metal, a circuit layer number is generated based on the mask layer code of the missing layer. In this example, the circuit layer number 191A is generated by appending the letter "A" to the mask layer code 191 for layer number 4. Subsequently, when generating the mask set, no circuit layer patterns are formed in device 1P4M in response to the layer 191A.

TABLE 3E

| No | Mask Layer Name | Mask Layer Code | CKT-Layer |
|---|---|---|---|
| 1 | L1 | 119 | 1 |
| 2 | L2 | 120 | 2 |
| 3 | L3 | 121 | 3 |
| 4 | L4 | 191 | 191A |
| 5 | CONTACT | 118 | 4 |
| 6 | M1 | 160 | 16 |
| 7 | VIA1 | 178 | 17 |
| 8 | M2 | 180 | 18 |
| 9 | VIA2 | 179 | 27 |
| 10 | M3 | 181 | 28 |
| 11 | VIA3 | 173 | 27 |
| 12 | M4 | 184 | 28 |
| 13 | Top VIA | 174 | 32 |
| 14 | Top Metal | 185 | 33 |
| 15 | PAD | 107 | 19 |

Tables 3F–3G show the iteration of steps 208–218 of FIG. 2 applied to device 1P5M (Table 1C). In Table 3F, all of the circuit layer numbers of the MT template that are present in table 1C re copied into the corresponding rows of the new MT form. Layers 3 and 4 (L3, L4) are not included in this device.

TABLE 3F

| No | Mask Layer Name | Mask Layer Code | CKT-Layer |
|---|---|---|---|
| 1 | L1 | 119 | 1 |
| 2 | L2 | 120 | 2 |
| 3 | L3 | 121 | |
| 4 | L4 | 191 | |
| 5 | CONTACT | 118 | 3 |
| 6 | M1 | 160 | 16 |
| 7 | VIA1 | 178 | 17 |
| 8 | M2 | 180 | 18 |
| 9 | VIA2 | 179 | 27 |
| 10 | M3 | 181 | 28 |
| 11 | VIA3 | 173 | 29 |
| 12 | M4 | 184 | 31 |
| 13 | Top VIA | 174 | 39 |
| 14 | Top Metal | 185 | 38 |
| 15 | PAD | 107 | 19 |

In Table 3G, the two missing rows of the circuit layer number column are filled in. For the missing layers (3 and 4) that are neither via or metal, a circuit layer number is generated based on the mask layer code of the missing layer. In this example, the circuit layer numbers 121A and 191A are generated by appending the letter "A" to the mask layer codes 121 and 191, respectively for layer numbers 3 and 4. Subsequently, when generating the mask set, no circuit layer patterns are formed in device 1P5M in response to the layers 121A and 191A.

TABLE 3G

| No | Mask Layer Name | Mask Layer Code | CKT-Layer |
|---|---|---|---|
| 1 | L1 | 119 | 1 |
| 2 | L2 | 120 | 2 |
| 3 | L3 | 121 | 121A |
| 4 | L4 | 191 | 191A |
| 5 | CONTACT | 118 | 3 |
| 6 | M1 | 160 | 16 |
| 7 | VIA1 | 178 | 17 |
| 8 | M2 | 180 | 18 |
| 9 | VIA2 | 179 | 27 |
| 10 | M3 | 181 | 28 |
| 11 | VIA3 | 173 | 29 |
| 12 | M4 | 184 | 31 |
| 13 | Top VIA | 174 | 39 |
| 14 | Top Metal | 185 | 38 |
| 15 | PAD | 107 | 19 |

Using the above method, a new MT form is automatically generated with the metal and via patterns inserted into the appropriate layers for a complete MPW mask set.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard disk drives, ZIP™ drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for translating mask tooling information, comprising the steps of:
    (a) receiving a plurality of input mask tooling forms for fabricating a wafer, at least two of the plurality of input masking tool forms having respectively different sequences of layers;
    (b) forming a template having a sequence of layers formed by the union of the different sequences of layers; and
    (c) translating information from each of the plurality of input mask tooling forms to fit the template.

2. The method of claim 1, wherein step (b) is performed automatically.

3. The method of claim 1, wherein step (c) is performed automatically.

4. The method of claim 1, wherein step (c) includes (c1) copying the template into a new mask tooling form;

(c2) copying a description of each layer of one of the plurality of input mask tooling forms into a corresponding layer of the new mask tooling form; and (c3) automatically generating a description for each layer of the new mask tooling form for which there is no corresponding layer in the same one of the plurality of input mask tooling forms.

5. The method of claim 4, wherein:

each layer of the same one of the plurality of input mask tooling forms and each layer of the new mask tooling form have respective circuit layer codes, and step (c3) includes generating a circuit layer code for a metal layer in the new mask tooling form that is the same as a circuit layer code of a penultimate metal layer in the same one of the plurality of input mask tooling forms.

6. The method of claim 4, wherein:

each layer of the same one of the plurality of input mask tooling forms and each layer of the new mask tooling form have respective circuit layer codes, and step (c3) includes generating a circuit layer code for a via layer in the new mask tooling form that is the same as a circuit layer code of a penultimate via layer in the same one of plurality of input mask tooling forms.

7. The method of claim 4, wherein:

each layer of the same one the of plurality of input mask tooling forms and each layer of the new mask tooling form have respective circuit layer codes, and step (c3) includes:

generating a circuit layer code for a via layer in the new mask tooling form that is the same as a circuit layer code of a penultimate via layer in the same one of the plurality of input mask tooling forms; and generating a circuit layer code for a metal layer in the new mask tooling form that is the same as a circuit layer code of a penultimate metal layer in the same one of the plurality of input mask tooling form.

8. The method of claim 4, wherein:

each layer of the same one of the plurality of input mask tooling forms and each layer of the new mask tooling form have respective circuit layer codes and respective mask layer codes, and step (c3) includes:

generating a circuit layer code for one layer of the new mask tooling form for which there is no corresponding layer in the same one of the plurality of input mask tooling forms, the generated circuit layer code being based on the mask layer code of the one layer of the new mask tooling form.

9. The method of claim 1, further comprising forming a mask set for a multi-project wafer using the translated mask tooling information.

10. The method of claim 1, wherein:

steps (b) and (c) are performed automatically;

each layer of the the same one of the plurality of input mask tooling forms and each layer of the new mask tooling form have respective circuit layer codes and respective mask layer codes; and step (c) includes (c1) copying the template into a new mask tooling form, (c2) copying a description of each layer of one of the plurality of input mask tooling forms into a corresponding layer of the new mask tooling form, and (c3) automatically generating a description for each layer of the new mask tooling form for which there is no corresponding layer in the same one of the plurality of input mask tooling forms, including:

generating a circuit layer code for a via layer in the new mask tooling form that is the same as a circuit layer code of a penultimate via layer in the same one of the plurality of input mask tooling forms, generating a circuit layer code for a metal layer in the new mask tooling form that is the same as a circuit layer code of a penultimate metal layer in the same one of the plurality of input mask tooling forms, and generating a circuit layer code for one layer of the new mask tooling form for which there is no corresponding layer in the same one of the plurality of input mask tooling forms, the generated circuit layer code being based on the mask layer code of the one layer of the new mask tooling form.

11. The method of claim 10, further comprising forming a mask set for a multi-project wafer using the translated mask tooling information.

12. A system for translating mask tooling information, comprising:

means for receiving a plurality of input mask tooling forms for fabricating a wafer, at least two of the plurality of input masking tool forms having respectively different sequences of layers;

means for forming a template having a sequence of layers formed by the union of the different sequences of layers; and means for translating information from each of the plurality of input mask tooling forms to fit the template.

13. The system of claim 12, wherein the template forming means includes:

means for copying the template into a new mask tooling form;

means for copying a description of each layer of one of the plurality of input mask tooling forms into a corresponding layer of the new mask tooling form; and means for automatically generating a description for each layer of the new mask tooling form for which there is no corresponding layer in the same one of the plurality of input mask tooling forms.

14. The system of claim 13, wherein:

each layer of the the same one of plurality of input mask tooling forms and each layer of the new mask tooling form have respective circuit layer codes, and the means for automatically generating a description includes means for generating a circuit layer code for a metal layer in the new mask tooling form that is the same as a circuit layer code of a penultimate metal layer in the same one of the plurality of input mask tooling forms.

15. The system of claim 13, wherein:

each layer of the same one of the plurality of input mask tooling forms and each layer of the new mask tooling form have respective circuit layer codes, and means for automatically generating a description includes means for generating a circuit layer code for a via layer in the new mask tooling form that is the same as a circuit layer code of a penultimate via layer in the same one of the plurality of input mask tooling forms.

16. The system of claim 13, wherein:

each layer of the same one of the plurality of input mask tooling forms and each layer of the new mask tooling form have respective circuit layer codes, and the means for automatically generating a description includes:

means for generating a circuit layer code for a via layer in the new mask tooling form that is the same as a circuit layer code of a penultimate via layer in the same one of the plurality of input mask tooling forms; and means for generating a circuit layer code for a metal layer in the new mask tooling form that is the same as a circuit layer code of a penultimate metal layer in one of the plurality of input mask tooling forms.

17. The system of claim 13, wherein:

each layer of the same one of the plurality of input mask tooling forms and each layer of the new mask tooling form have respective circuit layer codes and respective mask layer codes, and the means for automatically generating a description includes:

means for generating a circuit layer code for one layer of the new mask tooling form for which there is no corresponding layer in the same one of the plurality of input mask tooling forms, the generated circuit layer code being based on the mask layer code of the one layer of the new mask tooling form.

18. A computer readable medium encoded with computer program code for causing a computer to translate mask tooling information, comprising:

means for causing the computer to receive a plurality of input mask tooling forms for fabricating a wafer, at least two of the plurality of input masking tool forms having respectively different sequences of layers;

means for causing the computer to form a template having a sequence of layers formed by the union of the different sequences of layers; and means for causing the computer to translate information from each of the plurality of input mask tooling forms to fit the template.

19. The system of claim 18, wherein the template forming means includes:

means for causing the computer to copy the template into a new mask tooling form;

means for causing the computer to copy a description of each layer of one of the plurality of input mask tooling forms into a corresponding layer of the new mask tooling form; and means for causing the computer to automatically generate a description for each layer of the new mask tooling form for which there is no corresponding layer in the same one of the plurality of input mask tooling forms.

20. The system of claim 19, wherein:

each layer of one of the plurality of input mask tooling forms and each layer of the new mask tooling form have respective circuit layer codes, and the means for causing the computer to automatically generate a description includes means for causing the computer to generate a circuit layer code for a metal layer in the new mask tooling form that is the same as a circuit layer code of a penultimate metal layer in the same one of the plurality of input mask tooling forms.

21. The system of claim 19, wherein:

each layer of the same one of the plurality of input mask tooling forms and each layer of the new mask tooling form have respective circuit layer codes, and means for causing the computer to automatically generate a description includes means for causing the computer to generate a circuit layer code for a via layer in the new mask tooling form that is the same as a circuit layer code of a penultimate via layer in the same one of the plurality of input mask tooling forms.

22. The system of claim 19, wherein:

each layer of the same one of the plurality of input mask tooling forms and each layer of the new mask tooling form have respective circuit layer codes, and the means for causing the computer to automatically generate a description includes:

means for causing the computer to generate a circuit layer code for a via layer in the new mask tooling form that is the same as a circuit layer code of a penultimate via layer in the same one of the plurality of input mask tooling forms; and means for causing the computer to generate a circuit layer code for a metal layer in the new mask tooling form that is the same as a circuit layer code of a penultimate metal layer in the same one of the plurality of input mask tooling forms.

23. The system of claim 19, wherein:

each layer of the same one of the plurality of input mask tooling forms and each layer of the new mask tooling form have respective circuit layer codes and respective mask layer codes, and the means for causing the computer to automatically generate a description includes:

means for causing the computer to generate a circuit layer code for one layer of the new mask tooling form for which there is no corresponding layer in the same one of the plurality of input mask tooling forms, the generated circuit layer code being based on the mask layer code of the same one of the plurality of input mask tooling forms.

* * * * *